United States Patent
Demoulin et al.

(10) Patent No.: US 7,953,191 B2
(45) Date of Patent: May 31, 2011

(54) GAIN CONTROL METHOD AND DEVICE FOR A BURSTY DATA FRAME RECEPTION SYSTEM

(75) Inventors: Vincent Demoulin, Monfort sur Meu (FR); Olivier Mocquard, Rennes (FR); Samuel Guillouard, Chantepie (FR); Franck Thudor, Rennes (FR); Jean-Yves Le Naour, Pace (FR); Jacques Perraudeau, Betton (FR)

(73) Assignee: Thomson Licensing, Boulogne-Billancourt (FR)

( * ) Notice: Subject to any disclaimer, the term of this patent is extended or adjusted under 35 U.S.C. 154(b) by 860 days.

(21) Appl. No.: 11/641,352

(22) Filed: Dec. 19, 2006

(65) Prior Publication Data

US 2007/0147557 A1 Jun. 28, 2007

(30) Foreign Application Priority Data

Dec. 28, 2005 (FR) ...................... 05 54115

(51) Int. Cl.
*H04L 27/08* (2006.01)
*H04L 1/02* (2006.01)
*H04B 1/06* (2006.01)

(52) U.S. Cl. .................. 375/345; 375/347; 455/234.1; 455/272

(58) Field of Classification Search .......... 375/345, 375/347; 455/232.1, 234.1, 239.1, 240.1, 455/241.1, 272

See application file for complete search history.

(56) References Cited

U.S. PATENT DOCUMENTS

| | | | |
|---|---|---|---|
| 3,740,471 A | 6/1973 | Wilcox | |
| 5,575,003 A | 11/1996 | Mycynek | |
| 7,054,605 B1 * | 5/2006 | Groe | 455/234.1 |
| 7,271,852 B2 * | 9/2007 | Paik et al. | 375/345 |
| 7,463,704 B1 * | 12/2008 | Tehrani et al. | 375/345 |
| 2005/0129150 A1 * | 6/2005 | Terao | 375/345 |

FOREIGN PATENT DOCUMENTS

| | | |
|---|---|---|
| EP | 0 859 462 A1 | 8/1998 |
| EP | 1 335 490 A2 | 8/2003 |
| GB | 1 188 752 A | 4/1970 |

OTHER PUBLICATIONS

European Search Report, Aug. 2006.

* cited by examiner

*Primary Examiner* — Betsy L Deppe
(74) *Attorney, Agent, or Firm* — Robert D. Shedd; Jeffrey M. Navon

(57) ABSTRACT

The gain control method for the RF and IF amplification stages of a bursty data frame reception system enables, following a step for evaluating the received signal strength, the gain adjustment step of the RF amplification stage to be temporarily deferred until a frame structure symbol is received, during which the gain adjustment step of the IF amplification stage takes place simultaneously with that of the RF gain, while retaining an overall gain linearly dependent on the input signal strength. The corresponding device comprises a control element 46 which generates the control signal for the RF and IF gain amplifiers

12 Claims, 4 Drawing Sheets

GAIN CONTROL METHOD AND DEVICE FOR A BURSTY DATA FRAME RECEPTION SYSTEM

This application claims the benefit, under 35 U.S.C. §119 of French Patent Application 0554115, filed Dec. 28, 2005.

FIELD OF THE INVENTION

This invention relates to a gain control method and device for a bursty data frame reception system in a high speed digital radiocommunication system, in particular for high definition video (HDTV) links between a mobile source that needs to be controlled remotely and a fixed receiver where the controller of the source is also located. More specifically, this invention applies to the case of a wireless video link between a camera generating the video stream and a studio where an operator needs to regularly intervene remotely on certain camera parameters. This invention also relates to a gain control method and device for a reception system with antenna diversity.

Implementing a bidirectional link is equivalent to accessing the transmission channel in a shared way to ensure that the uplink and downlink accesses do not disturb each other.

DESCRIPTION OF THE PRIOR ART

There are, today, three main channel access techniques for implementing a bidirectional link. These are FDMA (Frequency Division Multiple Access) type access, TDMA (Time Division Multiple Access) type access and, finally, CDMA (Code Division Multiple Access) type access.

FDMA type access is well suited to our application, and is moreover implemented in the current systems. Its principle is particularly simple: the uplink and the downlink use different frequency channels. The two transmissions are continuous, of broadcast type. They are therefore particularly robust. In practice, once the initialization phase is finished at the receiver end, the automatic gain control loop and the equalizer are particularly stable so ensuring a good reception quality.

However, in the context of a system that is strongly asymmetrical in terms of bit rate to be transmitted, in order to be effective, FDMA type access requires the parallel implementation of two different communication systems, one being suited to the high bit rates and the other to the lower bit rates and therefore with a narrower bandwidth.

As for the TDMA type access, the principle of this is to share time on one and the same frequency channel between the uplink and the downlink. In the case of an asymmetrical system, the temporal split is made in favour of the link requiring the higher bit rate. The distribution in time of the bursts of data can be organized within a structure called a frame, or even be organized more randomly. In the latter case, there are numerous protocols for defining access to the channel. However, none of them can guarantee the quality of service and efficiency obtained with frame-oriented systems. As an illustration, it can be noted that the GSM networks are bursty frame systems whereas the WiFi type wireless local area networks are random access systems.

The systems corresponding to TDMA type access do, however, present a major defect originating from the discontinuity of the signals. In practice, conventionally, at the start of each data burst, the gain level of the RF stage of the receiver and the equalizer must be reset. To ensure good system efficiency, this so-called locking-on phase must be as short as possible.

The bursts of data, as represented in FIG. 1, normally begin with one or more special symbols called preambles. The IEEE802.16 standard also introduces the concept of midamble. Midambles are special symbols inserted in the middle of the bursts which, like the preambles, enable the equalizer to be reset and the automatic gain control (AGC) loop to be readjusted. In the direction in which the largest quantity of data needs to be transported, a frame comprises several adjoining bursts transmitted in succession. While a data burst is being received, the gain of the RF (radio frequency) amplifier is not readjusted. The equalizer on its own tracks the trend of the channel, both with regard to its impulse response (or frequency response in the case of a multiple-carrier modulation) and its average attenuation. In the case of a link. where the level of the channel changes rapidly, the preambles must be repeated frequently in order to enable the equalizer to remain in its operating band. However, frequently repeating system resets tends to lower overall system performance.

In the context that we are interested in, the simplest way of combining the advantages of a continuous link without resetting of the equalizer and of the gain of the tuner stage of the receiver with those of a better suited bursty frame link in the case of a bidirectional system, entails splitting a frame into two bursts of unequal lengths, the longer being used to transport video data and the shorter being used in the other direction to control the source. The video burst then comprises only a preamble at its start in order to ensure the requisite initializations. Then, during the burst, the equalizer and the gain of the IF (Intermediate Frequency) stage are adjusted regularly.

However, this method does not afford sufficient flexibility of use.

Another system where the adjustment of the gain is done using two variable gain stages is described by document US2003/0083030. FIG. 2 shows the simplified architecture of the tuner stage of the receiver of this system. The input signal IN is applied to a variable gain RF amplifier 1 to be amplified, then this amplified signal is mixed with a reference signal REF at a determined frequency on a mixer 2 in order to obtain a resultant intermediate frequency IF signal. The latter is filtered by a filter 4 and amplified again by a linear variable gain IF amplifier 3 to form the desired output signal OUT. This signal is then applied to a demodulator as is known to those skilled in the art. The controls 5, 6 of the RF and IF amplifiers are given by a control circuit receiving an RSSI (received signal strength indication) from the output signal (not shown). The RF amplifier is switched to a so-called "low gain" position or to another so-called "high gain" position depending on the control. This document does not describe the problems caused by switching the RF amplifier from one position to the other.

As illustrated in FIG. 3 which represents a level diagram of the two gains, RF and IF, according to the input signal strength, the RF stage can comprise an adjustable gain amplifier which presents a high dynamic range but also strong discontinuities of the order of 10 to 15 dB and the IF gain can be adjusted continuously. By combining the two gain controls, the overall gain is obtained.

However, when the RF gain is adjusted, the signal can be subjected to major transient disturbances, both on the phase and on the amplitude. In practice, to ensure the continuity of the adjustment, when adjusting the RF gain, an adjustment of the IF gain is essential. Since the RF and IF variable gains are applied either side of the surface acoustic wave filter which presents a high latency, it is theoretically possible to avoid damaging transient phenomena by sending the RF control before the IF gain control. In practice, it is not possible to completely avoid the transient disturbances on the signal and it is difficult to guarantee to the latter good characteristics in terms of noise and linearity in the context in which we are interested where a high wide dynamic range is necessary.

Furthermore, these disturbances have a harmful effect on the equalizer of the demodulator, making it lose its synchronization and therefore its ability to compensate for the effects of the transmission channel. This ultimately leads to the appearance of bit errors on the decoded signal.

SUMMARY OF THE INVENTION

To overcome these drawbacks, the invention proposes a gain control method for the RF and IF amplification stages of a bursty data frame reception system, each burst comprising frame structure symbols called preamble or midamble.

Following a step for evaluating the received signal strength, a gain recovery band enables the gain adjustment step of the RF amplification stage to be temporarily deferred until a frame structure symbol is received, during which the IF gain adjustment step takes place at the same time as that of the RF gain while retaining an overall gain linearly dependent on the input signal strength.

By combining the two gain controls, the advantage of the invention is to obtain an adjustment with the required high dynamic range while retaining good RF performance levels.

Furthermore, this method has the advantage of making it possible to improve the stability and robustness of a TDMA system in terms of equalization and AGC.

Preferably, the width of the recovery band corresponds to the possible trend of the strength of the received signal during one frame.

Preferably, following the change of gain of the RF amplifier, a reset indication is sent to the equalizer element of the demodulator of the reception system.

The invention also proposes an RF and IF gain control device of the amplifiers of a bursty data frame reception system, each burst comprising special frame structure symbols called preamble or midamble. This device comprises a control element which generates an RF and IF gain amplifier control signal, enabling the adjustment of the gain of the RF amplifier to be temporarily deferred until a frame structure indication is received, in a gain recovery band during which the adjustment step of the IF gain takes place in parallel with that of the RF gain, while retaining an overall gain linearly dependent on the input signal strength.

The control element generates a signal enabling the demodulator of the reception system to be reset following the modification of the RF gain.

The control element comprises a delay element for temporarily deferring the control of the IF gain amplifier relative to the control of the RF gain amplifier according to the delay introduced by the filtering element located between the two RF and IF amplifiers.

The control element comprises a switchable filter for filtering the control of the IF gain amplifier when the adjustment of the RF gain is not necessary.

The invention also relates to a method of controlling the gains of the RF and IF amplifier stages of a bursty data frame reception system with a plurality of antennas N, each burst comprising special frame structure symbols called preamble and midamble, and comprising a step for adjusting the gains of the RF stage and of the IF stage. Following a step for evaluating the received signal strengths of each of the N reception subsystems associated with each of the N antennas, gain recovery bands enable the step for adjusting the RF amplification gain of each subsystem to be temporarily deferred until a frame structure indication is received, during which the corresponding IF gain adjustment step takes place at the same time as that of the RF gain, while retaining for each subsystem an overall gain linearly dependent on the input signal strength.

Preferably, a single RF gain of one of the reception subsystems is modified on the current preamble, any other RF gain adjustments of the other reception subsystems taking place during subsequent preambles.

The invention also relates to a bursty data frame reception system with a plurality of antennas, each burst comprising special frame structure symbols called preamble or midamble, comprising N reception subsystems associated with the N antennas and a control device of the RF and IF gain amplifiers of the N reception subsystems. The device comprises a control element which generates N control signals for the RF and IF gain amplifiers enabling the adjustment of the gain of the RF amplifier of a reception subsystem to be temporarily deferred until a frame structure indication is received in a gain recovery band during which the IF gain adjustment step takes place in parallel with that of the RF gain, while retaining an overall gain linearly dependent on the input signal strength.

Preferably, following the change of the RF gain of one of the reception subsystems, the control element generates a signal enabling the demodulator of the system to be reset. The resetting of the demodulator takes place either on the equalizer element corresponding to this subsystem of the demodulator or on the combination or selection element of the demodulator.

DESCRIPTION OF THE DRAWINGS

The abovementioned characteristics and advantages of the invention, and others, will become more clearly apparent from reading the description that follows, given in relation to the appended drawings, in which.

To simplify the description, the same references will be used in these latter figures to denote elements fulfilling the same functions.

DESCRIPTION OF THE PREFERRED EMBODIMENTS

Figure 4:
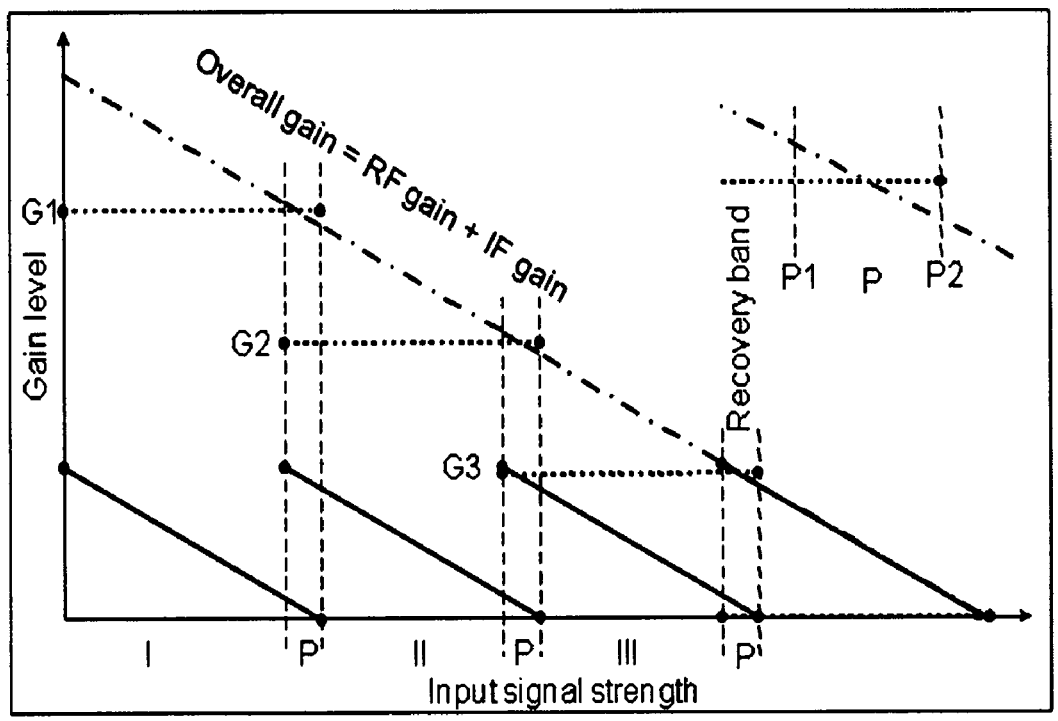
FIG. 4 is a diagram representing the principle of adjustment of the overall gain of the tuner stage according to the invention.

There now follows a description, with FIG. 4, of the principle of adjustment of the overall gain of the tuner stage according to the invention.

The adjustment of the gain of the stage is divided into two gain controls (RF and IF) each delivered to the tuner stage. The IF gain is represented by a solid line. This gain decreases linearly as a function of the input signal strength. This IF gain is adjusted regularly, on each symbol received as in a continuous system.

The RF gain is represented by a broken line. It is constant in the areas I, II and III and varies in successive levels. Now, the adjustment of this RF gain is allowed only if the received symbol is a preamble or a midamble. If the symbol is a data symbol, the adjustment of the RF gain is put back until the next preamble or midamble.

The overall gain, which is the sum of the RF and IF gains, decreases linearly when the input signal strength increases, so that there is, at the output, a constant strength signal. This figure shows the presence of a signal strength recovery band P delimited by a minimum value P1 and a maximum value P2 making it possible to obtain the same overall gain with two different RF and IF gain combinations. The values of the thresholds P1 and P2 are, for example, determined such that they correspond to the trend of the input signal strength during the transmission of a burst of data between two preambles/midambles.

These bands can be used to delay the adjustment of the gain between the moment when it is considered necessary, that is, on reception of a data symbol, and the moment when a preamble or midamble is received when this adjustment takes place. The adjustment of the RF gain is triggered when the signal strength reaches one of the limit values of the recovery bands P1, P2.

If the input signal strength is increasing then, at the threshold P1, the adjustment of the RF gain is considered necessary. The change of gain of the RF amplifier from the value G1 to the value G2 can take place only on the next preamble/midamble so as not to lose data during transient disturbances. A certain time delay corresponding to the time between which the adjustment decision has been taken and the next preamble/midamble will elapse before the adjustment of the RF gain takes place. During this time, the input signal strength continues to change within the recovery band, possibly reaching a value close to P2. On a preamble/midamble of the burst of data, the gain of the RF amplifier will therefore switch from the value G1 to G2. Consequently, the IF gain will be switched to a value close to its maximum value.

When the input signal strength is decreasing, the gain adjustment process will be triggered when the signal strength reaches the. value P2 and applied on the preamble/midamble following this triggering. The gain of the RF amplifier changes from the value G2 to G1 whereas the gain of the IF amplifier will switch to a value close to its minimum value.

This recovery band therefore makes it possible to adjust the gains only at the moment when this adjustment is allowed without disturbing the linearity of the overall gain. The width of this recovery band is calculated as a function of the trend of the signal strength between two preambles/midambles. The maximum signal strength variation difference between two preambles/midambles therefore corresponds to the width P2-P1 of the recovery band.

In parallel, each other recovery band will have corresponding different input signal strength limit values and different gain levels G2, G3. A delay between the moment when the adjustment of the RF gain is deemed necessary and is allowed will therefore be possible.

Figure 5:
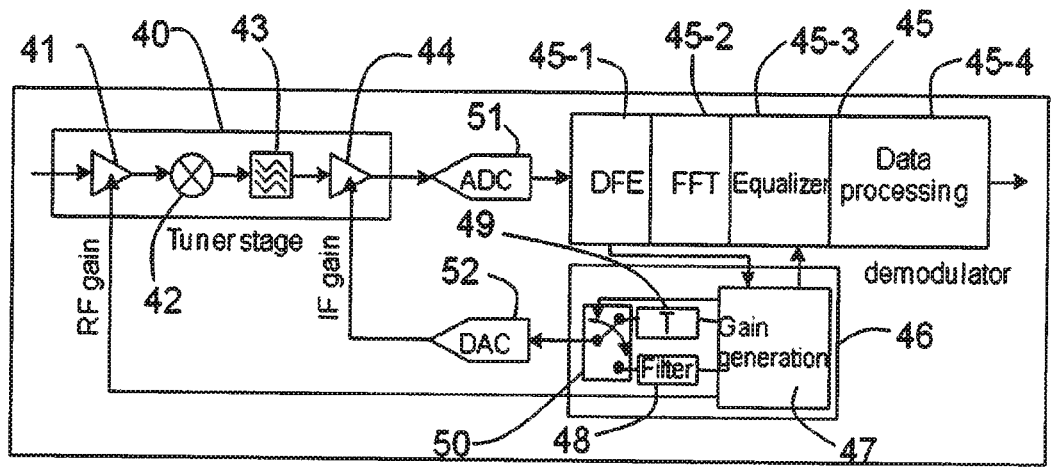
FIG. 5 is an exemplary implementation of the system according to the invention.

FIG. 5 is an exemplary implementation of the device according to the invention. The stages of the reception subsystem affected by the invention are represented in this diagram. The OFDM (Orthogonal Frequency Division Multiplexing) modulated received signal is applied to the input of the tuner stage 40. This signal is amplified by a variable gain RF amplifier 41 then applied to a mixer 42 which transforms the RF signal into an intermediate frequency IF signal. This signal is then filtered by a surface acoustic wave SAW filter 43, then reamplified by a variable gain IF amplifier 44 at intermediate frequency. These amplifiers have gain controls originating from a control element (driver) 46.

The amplified and filtered IF signal obtained from the tuner element 40 is applied to the demodulator 45 via an analogue-digital converter ADC 51 to be demodulated. The level of the adjustment required for the gain of the tuner stage 40 is calculated by the demodulator 45. The input interface (or digital front end (DFE)) stage 45-1 of the demodulator makes it possible to evaluate the received strength of the signal from the tuner stage. This data is transmitted to the control element 46 on each new OFDM signal received.

An FFT (Fast Fourier Transform) demodulator stage 45-2 is used to demodulate the signal.

The signal is then equalized by the equalizer 45-3, controlled by a signal emitted by the driver element 46. A data processing (bit processing) circuit 45-4, well known to those skilled in the art, is used to emit the desired demodulated signal.

For each new symbol, the measurement of the input signal strength is transmitted to the control element 46 which is responsible for generating the RF and IF gain controls sent to the tuner stage 40.

There are two possible cases:

In the first case, the measurement of the input signal strength indicates that the adjustment of the RF gain is not necessary, which corresponds to the great majority of cases, so only the gain of the IF stage is adjusted on each symbol received regularly as in a continuous system and regardless of the type of symbol received (data or preamble). The IF gain control is filtered by the filter 48 in order to avoid excessively strong discontinuities on the strength level of the signal present at the input of the demodulator. Such level discontinuities could also disturb the equalizer. The selector 50 of the tuner element is therefore in the "filter" position. The filtered and selected signal is then applied, via a digital-analogue converter (DAC) 52, as control of the IF amplifier 44.

The equalizer 45-3 is then only updated in a manner well known to those skilled in the art by using, for example, a least mean squares (LMS) algorithm. In the case of a preamble, this update can be done with specific parameters providing the equalizer with a greater robustness.

In the second case, the value of the measured signal input strength is between a threshold P1 and a threshold P2, so that adjustment of the RF gain is necessary, but the latter is allowed only if the received symbol is a preamble or a midamble. A frame indication is therefore transmitted to the control element 46 and makes it possible to await the presence of a preamble or midamble.

In the absence of a preamble or midamble, that is, if the adjustment is requested on reception of a data symbol, only the IF gain is modified as stated previously and the adjustment of the RF gain is put back until the next preamble/midamble. This is made possible by the recovery band P.

In the presence of a preamble/midamble, an RF gain adjustment control is emitted by the control element. In parallel, an IF gain adjustment control is emitted by the gain generator 47. The selector 50 of the tuner element switches to the second position. A delay element 49 can be used to temporarily defer the IF gain adjustment control by a time T corresponding to the latency of the surface acoustic wave SAW filter inserted between the two amplifiers. The potential transient disturbances on the signal are thus compensated to the maximum.

Furthermore, this dual adjustment can take place only when a preamble is received, so the equalizer is not simply updated but completely reset.

In the case where the received signal strength varies little and is located around an area where the modification of the RF gain is necessary, it is possible to limit these modifications by applying the well known hysteresis mechanism.

By avoiding numerous pointless resets of the equalizer and using the latter in order to avoid the appearance of bit errors on the decoded signal on adjusting the RF gain, this method of updating the equalizer and of adjusting the gain of the RF stage makes it possible to improve the stability and the robustness of the demodulator and so to significantly improve its overall performance levels in terms of bit error ratio on the received signal.

Figure 6:
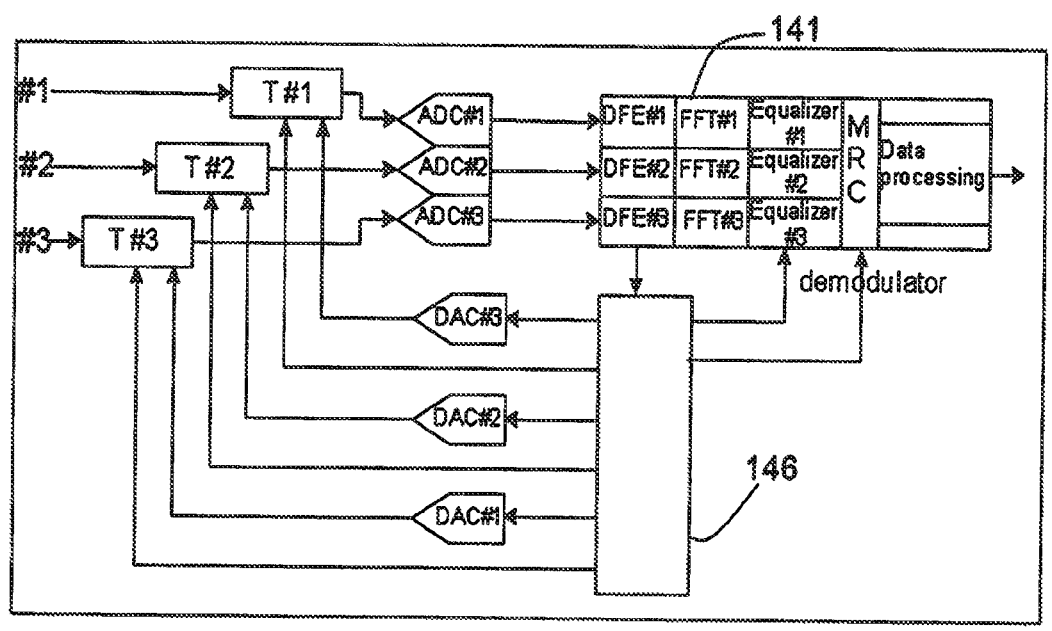
FIG. 6 represents another exemplary implementation of the invention with multiple-antenna reception.

FIG. 6 represents an exemplary implementation of the invention on reception with a plurality of antennas.

This invention can also be extended to the case of a reception with a plurality of antennas with, for example, MRC (Maximum Ratio Combining) type combination or with selection. The implementation of the invention for reception with third order MRC type combination is represented in FIG. 6. It could, obviously, be implemented for a different order MRC: either 2, or a number higher than 3. It can be seen that the presence of three independent reception channels #1, #2 and #3, each channel respectively comprising a tuner element T, an analogue-digital converter ADC circuit and elements that are part of the demodulator 141: a digital front-end element DFE, an FFT demodulation element and an equalizer E. The MRC (Maximum Ratio Combining) element for combining the different reception channels to optimize reception and the data processing circuit are, of course, common to the different reception channels. Each of the interface elements DFE of the channels #1, #2 and #3 sends a set point to the control circuit (driver) 146 which respectively manages the controls of the RF and IF amplifiers of the three tuners in the manner described using FIGS. 4 and 5 and notifies either the equalizer concerned or the MRC element when the modification of an RF gain of one of the reception channels is implemented to perform a reset.

Figure 1:
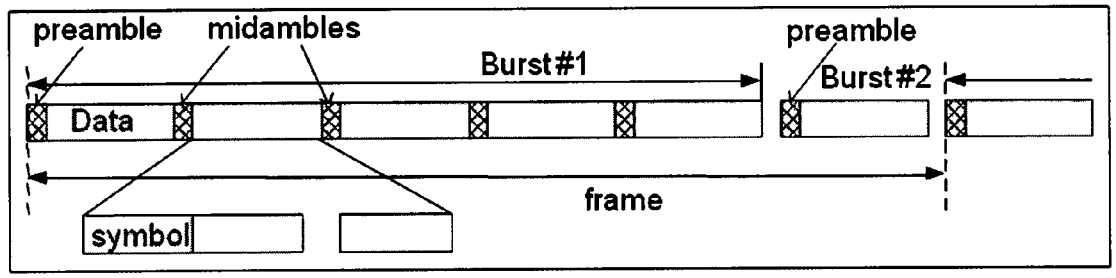
FIG. 1, already described, represents the structure of a bursty data frame.
Figure 2:
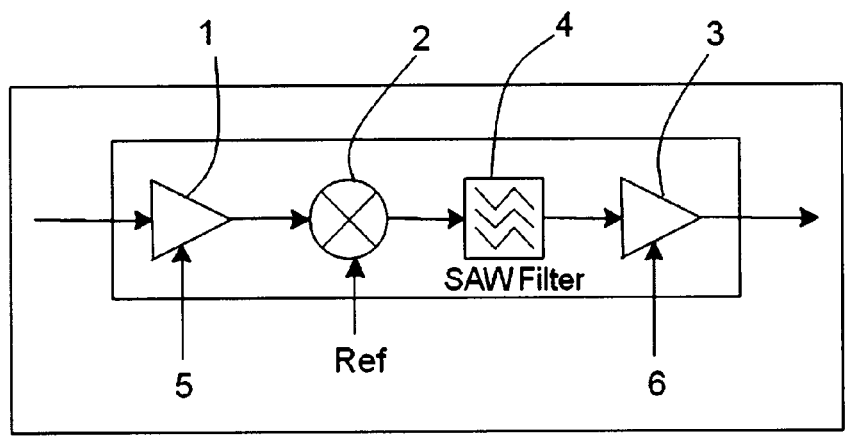
FIG. 2, already described, represents the simplified architecture of the tuner stage of the receiver of this system according to the state of the art.
Figure 3:
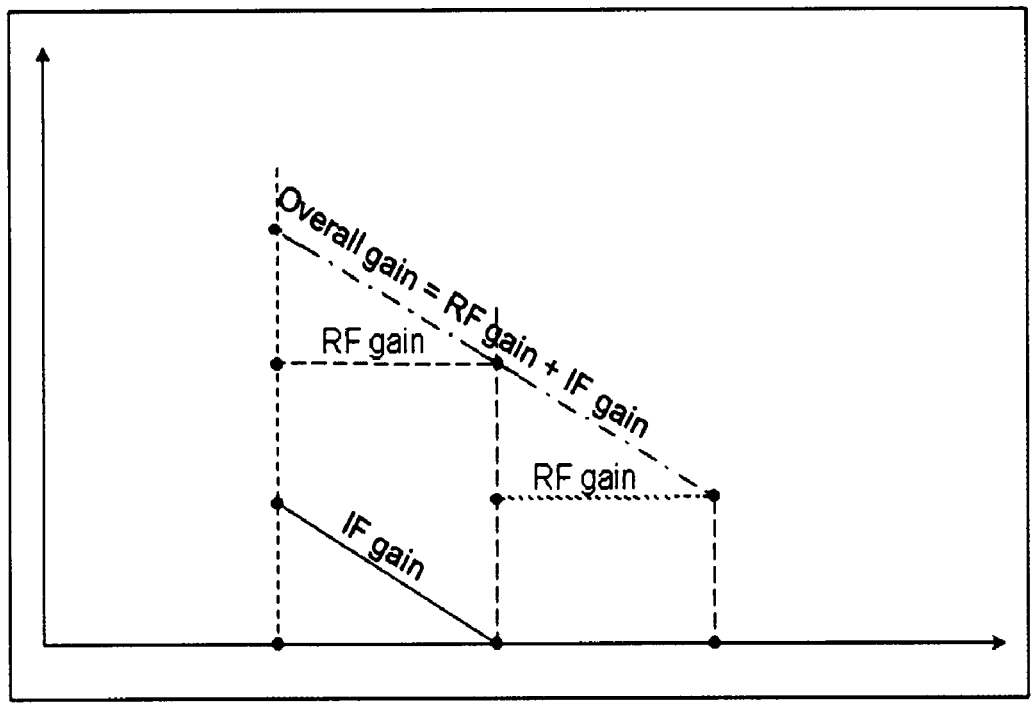
FIG. 3, already described, is a diagram representing the principle of adjustment of the overall gain of the tuner stage according to the state of the art.

In the recovery bands (see FIG. 3) of the IF and RF gains, the performance levels of the system are, for example, also optimized by allowing only a single RF gain modification at a time, at the time of the current preamble/midamble. The other adjustments take place at the time of the subsequent preambles/midambles. The control circuit 146 also manages the succession of these adjustments.

Figure 7:
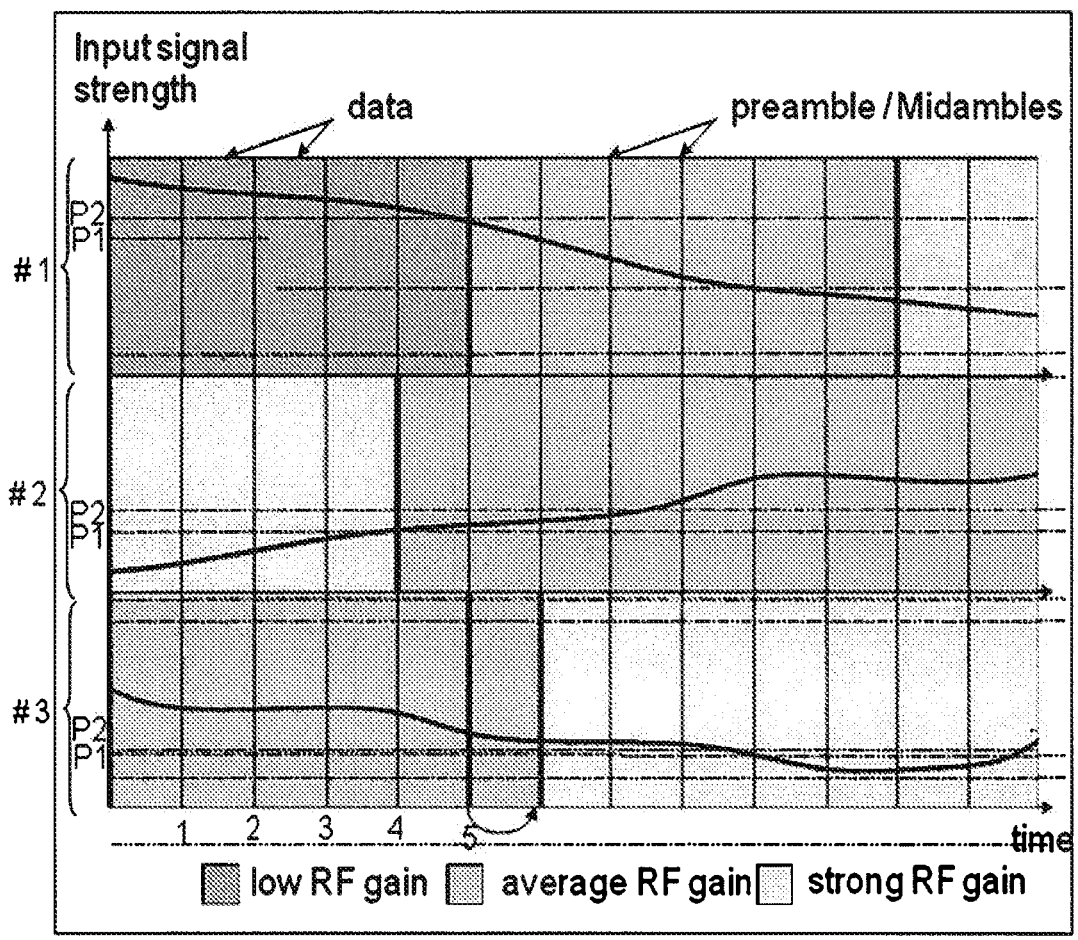
FIG. 7 is a diagram representing the operating mode of the various adjustments in the case of multiple-antenna reception.

FIG. 7 is a diagram showing an example of an operating mode for which the priority in the order of the adjustments of the amplifiers is given as a function of the IF gain values. In practice, if the gain generation block (see FIG. 5) needs to modify several RF gains, then just one of them is modified on the current preamble. The order in which the RF gains are modified can be determined, for example, as a function of the IF gain values. The RF gain associated with the IF gain closest to a limit of its operating band is modified first. Other orders of priority of modifications of the RF gains can be envisaged. The input signal strength of the amplifiers can, for example, also bring about a priority order. This diagram represents the input signal strengths of the different channels #1, #2 and #3, according to the trend of the data over time. The vertical lines symbolically represent the presence of preamble/midamble in the bursty data frame. The signal strength limit boundaries P1, P2 delimit the recovery bands. The trend of the signal strength of the channel #2 makes it possible to symbolically envisage a change of gain of the RF amplifier on the preamble 4, the signal strength having reached the threshold value P1 during the data preceding this preamble. The change of RF gain of the channel #1 and of the channel #3 would make it possible to symbolically envisage a change of gain of the RF amplifier on the preamble 5. These changes should, therefore, take place simultaneously, but that of the channel #3 is delayed so as to prevent the simultaneous changes of gain causing disturbances. The RF gain associated with the IF gain closest to a limit of its operating band is modified first. The change of RF gain of the channel #3 will be delayed and will take place with the preamble 6. The performance levels of the system are thus optimized.

The equalizer of the channel concerned is automatically reset following the change of the RF gain of this channel.

A variant entails sending to the MRC combination block an indication for it temporarily to disregard the data originating from the equalizer concerned, which can slightly simplify the algorithms involved at the equalizer level.

The invention claimed is:

1. A gain control method for the RF and IF amplification stages of a bursty data frame reception system, each burst comprising special frame structure symbols called preamble or midamble, wherein said method comprises the steps of:
   evaluating a received signal strength,
   adjusting the gain of the RF amplification stage on reception of a frame structure symbol when the received signal strength is within a signal strength recovery band (P),
   adjusting the gain of the IF amplification stage at the same time as said adjusting of the RF gain,
   wherein the adjusting steps maintain an overall gain that is linearly dependent on the received signal strength.

2. The gain control method according to claim 1, wherein the width of the recovery band corresponds to the possible trend of the signal strength between two special symbols allowing adjustment of the RF gain.

3. The gain control method according to claim 1, wherein, following the change of gain of the RF amplifier, a reset indication is sent to the equalizer element of the demodulator of the reception system.

4. A gain control device linked to RF and IF gain amplifiers of a bursty data frame reception system, each burst comprising special frame structure symbols called preamble or midamble, wherein the gain control device comprises a control element which generates an RF and IF gain amplifier control signal enabling adjustment of RF gain of the RF gain amplifier on reception of a frame structure indication when a received signal strength is within a signal strength recovery band P and adjustment of IF gain of the IF gain amplifier at the same time as said RF gain, wherein the adjusting steps maintain an overall gain that is linearly dependent on the received signal strength.

5. The gain control device according to claim 4, wherein the control element generates a signal enabling an equalizer element of a demodulator of the reception system to be reset following the adjustment of the RF gain.

6. The gain control device according to claim 4, wherein the control element comprises a switchable filter for filtering the control of the IF gain amplifier when the adjustment of the RF gain is not necessary.

7. A method of controlling the gains of the RF and IF amplifier stages of a bursty data frame reception system having a plurality of antennas N, each burst comprising special frame structure symbols wherein said method comprises the steps of:

evaluating the received signal strengths of each of N reception subsystems associated with each of the N antennas, adjusting the RF amplification gain of each subsystem on reception of a frame structure indication when the received signal strength is within a signal strength recovery band, adjusting the corresponding IF gain of each subsystem at the same time as said adjusting of the RF gain wherein the adjusting steps for each subsystem maintain an overall gain that is linearly dependent on the received signal strength associated with the respective subsystem.

8. The gain control method for the reception system having a plurality of antennas N according to claim 7, characterized in that the indication on the frame structure allowing the change of RF gain corresponds to the presence of a preamble or a midamble.

9. The gain control method for the reception system having a plurality of antennas N according to claim 8, characterized in that a single RF gain of one of the reception subsystems is modified on the current preamble, any other RF gain adjustments of the other reception subsystems taking place during subsequent preambles.

10. A bursty data frame reception system having a plurality of N antennas, each burst comprising special frame structure symbols called preamble or midamble, comprising N reception subsystems (#1, #2, #3) associated with the N antennas, each of the N reception subsystems comprising RF and IF gain amplifiers, wherein a control device of the RF and IF gain amplifiers of the N reception subsystems generates N control signals for the RF and IF gain amplifiers enabling adjustment of the RF gain of the RF amplifier of a reception subsystem on reception of a frame structure indication when a received signal strength is within a signal strength recovery band and adjustment of IF gain of the IF amplifier at the same time as said RF gain adjustment, wherein the adjusting steps maintain an overall gain that is linearly dependent on the received signal strength.

11. A data reception system having a plurality of N antennas according to claim 10, wherein the control element generates a signal enabling an equalizer element of a demodulator of the reception system to be reset following the adjustment of the RF gain of one of the reception subsystems.

12. A data reception system having a plurality of N antennas according to claim 10, wherein the control element generates a signal enabling a combination or selection element of a demodulator of the reception system to be reset following the adjustment of the RF gain of one of the reception subsystems.

* * * * *